US012596853B2

(12) United States Patent
Sato et al.

(10) Patent No.: US 12,596,853 B2
(45) Date of Patent: Apr. 7, 2026

(54) DEVELOPMENT SUPPORT APPARATUS, DEVELOPMENT SUPPORT METHOD, AND STATE DETECTION METHOD

(71) Applicant: GS Yuasa International Ltd., Kyoto (JP)

(72) Inventors: Katsuyuki Sato, Kyoto (JP); Muhammad Syahid Fitri Bin Azahar, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 1143 days.

(21) Appl. No.: 17/618,010

(22) PCT Filed: Jun. 9, 2020

(86) PCT No.: PCT/JP2020/022669
§ 371 (c)(1),
(2) Date: Dec. 10, 2021

(87) PCT Pub. No.: WO2020/255794
PCT Pub. Date: Dec. 24, 2020

(65) Prior Publication Data
US 2022/0237342 A1    Jul. 28, 2022

(30) Foreign Application Priority Data
Jun. 20, 2019    (JP) ................................. 2019-114361

(51) Int. Cl.
*G06F 30/20*    (2020.01)
(52) U.S. Cl.
CPC .................................. *G06F 30/20* (2020.01)

(58) Field of Classification Search
CPC .. G06F 30/20; G06F 2115/02; G06F 2119/06; G06F 30/367; G01R 31/36;
(Continued)

(56) References Cited

U.S. PATENT DOCUMENTS

| 8,577,529 B2 | 11/2013 | Takahashi et al. |
| 10,466,303 B2 | 11/2019 | Nishigaki et al. |

(Continued)

FOREIGN PATENT DOCUMENTS

| CN | 104181468 A | * | 12/2014 | ......... G01R 31/3651 |
| CN | 104462632 A | * | 3/2015 | ............... B60L 3/12 |

(Continued)

OTHER PUBLICATIONS

"Introduction to Model-Based Development of Automobile Systems", the Society of Automotive Engineers of Japan, Inc., First Edition, 2017, p. 77-81, total 8 pages; English translation; Cited in Specification.

(Continued)

*Primary Examiner* — Topaz L. Elliott
(74) *Attorney, Agent, or Firm* — RANKIN, HILL & CLARK LLP

(57) ABSTRACT
A development support apparatus includes: an estimation unit that estimates behavior of an energy storage device by using an equivalent circuit model reflecting a state of charge (SOC)-operating voltage characteristic in a high change-amount region where an amount of change in an operating voltage with respect to an amount of change in the SOC is relatively higher than in other regions among SOC-operating voltage characteristics during constant current charge and discharge of the energy storage device; and an output unit that outputs a result of an estimation by the estimation unit.

4 Claims, 10 Drawing Sheets

(58) Field of Classification Search
CPC .. G01R 31/367; G01R 31/382; G01R 31/385; G01R 31/389; G01R 31/392; G01R 31/388; H01M 10/48; H02J 7/00
See application file for complete search history.

(56) References Cited

U.S. PATENT DOCUMENTS

| | | | |
|---|---|---|---|
| 2002/0120906 A1 | 8/2002 | Xia et al. | |
| 2013/0185008 A1* | 7/2013 | Itabashi | G01R 31/389 |
| | | | 702/63 |
| 2014/0177145 A1 | 6/2014 | Kawahara et al. | |
| 2014/0368208 A1 | 12/2014 | Yamada | |
| 2018/0038918 A1 | 2/2018 | Nagaoka et al. | |
| 2019/0064276 A1* | 2/2019 | Kawai | G01R 31/367 |
| 2021/0103002 A1* | 4/2021 | Li | G01R 31/367 |

FOREIGN PATENT DOCUMENTS

| | | | | | |
|---|---|---|---|---|---|
| CN | 105548896 A | * | 5/2016 | | G01R 31/367 |
| CN | 109116251 A | * | 1/2019 | | |
| DE | 112016006166 T5 | | 9/2018 | | |
| GB | 2532726 A | * | 6/2016 | | G01R 31/367 |
| JP | 2005-274280 A | | 10/2005 | | |
| JP | 2010-283922 A | | 12/2010 | | |
| JP | 2012-247374 A | | 12/2012 | | |
| JP | 2014-119265 A | | 6/2014 | | |
| JP | 2017-122622 A | | 7/2017 | | |
| JP | 2017-227653 A | | 12/2017 | | |
| JP | 2018-009963 A | | 1/2018 | | |
| JP | 2018-41622 A | | 3/2018 | | |
| JP | 2018-63186 A | | 4/2018 | | |
| JP | 2018-77076 A | | 5/2018 | | |
| JP | 2018-141665 A | | 9/2018 | | |
| JP | 2018-146343 A | | 9/2018 | | |
| JP | 2019-90648 A | | 6/2019 | | |
| WO | 2013/141100 A1 | | 9/2013 | | |
| WO | 2016/136788 A1 | | 9/2016 | | |
| WO | 2017/119393 A1 | | 7/2017 | | |

OTHER PUBLICATIONS

International Search Report (ISR) dated Sep. 8, 2020 filed in PCT/JP2020/022669.

\* cited by examiner

Fig. 5

| Test type | Start SOC [%] | ΔSOC[%] | Discharge current [A] | Charge voltage [V] | Limited current [A] |
|---|---|---|---|---|---|
| Test A | 80/90/100 | ±2 | 0.2/0.5/1.0/1.5 $I_5$ 4.0/4.5/7.0/9.5 $I_5$ | 13 / 14 / 15 | 100 |
| Test B | 0/100 | ±100 | 0.1/0.2/0.4 $I_5$ | - | 0.1/0.2/0.4 $I_5$ |

DEVELOPMENT SUPPORT APPARATUS, DEVELOPMENT SUPPORT METHOD, AND STATE DETECTION METHOD

TECHNICAL FIELD

The present invention relates to a development support apparatus, a development support method, and a state detection method.

BACKGROUND ART

Secondary batteries such as lead-acid batteries and lithium ion batteries are widely used. For example, a secondary battery is mounted on a vehicle such as an automobile and used as a power supply source for a starter at the time of starting an engine and a power supply source for various electrical equipment such as a light.

As a method for simulating the charge-discharge behavior of the secondary battery, various methods using a mathematical model based on an electrochemical reaction or an equivalent circuit model expressed by a combination of electrical devices have been proposed.

For example, a model proposed by the Society of Automotive Engineers of Japan, Inc. (JSAE) is an equivalent circuit model on the assumption that a model structure and parameters are adjusted in accordance with a purpose (e.g., see Non-Patent Document 1). In this equivalent circuit model, various parameters in the equivalent circuit model are set on the basis of data obtained from an idling stop life test (hereinafter, SBA-IS (safety basic assessor-idling stop) test) defined in SBA_S0101, which is an industry standard, regarding a lead-acid battery for vehicles on which an idling stop system is mounted.

PRIOR ART DOCUMENT

Patent Document

Non-Patent Document 1: Introduction to Model-Based Development of Automobile Systems, the Society of Automotive Engineers of Japan, Inc., May 10, 2017, First Edition, p. 77-81

SUMMARY OF THE INVENTION

Problems to be Solved by the Invention

However, the usage of a secondary battery in a vehicle on which a charge control system is mounted is often finely controlled in accordance with a limited state of charge (SOC). It has been confirmed that in actual vehicle travel data in town, charge and discharge are repeated more frequently than in the SBA-IS test by charge-discharge control unique to the vehicle. Thus, in the above model referring only to the charge-discharge behavior during the SBA-IS test, there is a possibility that sufficient accuracy cannot be obtained in the charge-discharge control in the actual vehicle.

An object of the present invention is to provide a development support apparatus, a development support method, and a state detection method capable of estimating the behavior of an energy storage device by using a model in consideration of charge-discharge control in an actual vehicle and providing an estimation result to a user.

Means for Solving the Problems

A development support apparatus includes: an estimation unit that estimates behavior of an energy storage device by using an equivalent circuit model reflecting a state of charge (SOC)-operating voltage characteristic in a high change-amount region where an amount of change in an operating voltage with respect to an amount of change in the SOC is relatively higher than in other regions among SOC-operating voltage characteristics during constant current charge and discharge of the energy storage device; and an output unit that outputs a result of an estimation by the estimation unit.

A development support method using a computer includes: estimating behavior of an energy storage device by using an equivalent circuit model reflecting an SOC-operating voltage characteristic in a high change-amount region where an amount of change in an operating voltage with respect to an amount of change in the SOC is relatively higher than in other regions among SOC-operating voltage characteristics during constant current charge and discharge of the energy storage device; and outputting an estimation result of the behavior of the energy storage device.

A state detection method using a computer includes estimating a battery state from a measured value of an energy storage device by using an equivalent circuit model reflecting an SOC-operating voltage characteristic in a high change-amount region where an amount of change in an operating voltage with respect to an amount of change in the SOC is relatively higher than in other regions among SOC-operating voltage characteristics during constant current charge and discharge of the energy storage device.

BRIEF DESCRIPTION OF THE DRAWINGS

FIG. 5 is a table for explaining conditions of various tests.

MODE FOR CARRYING OUT THE INVENTION

Figure 1:
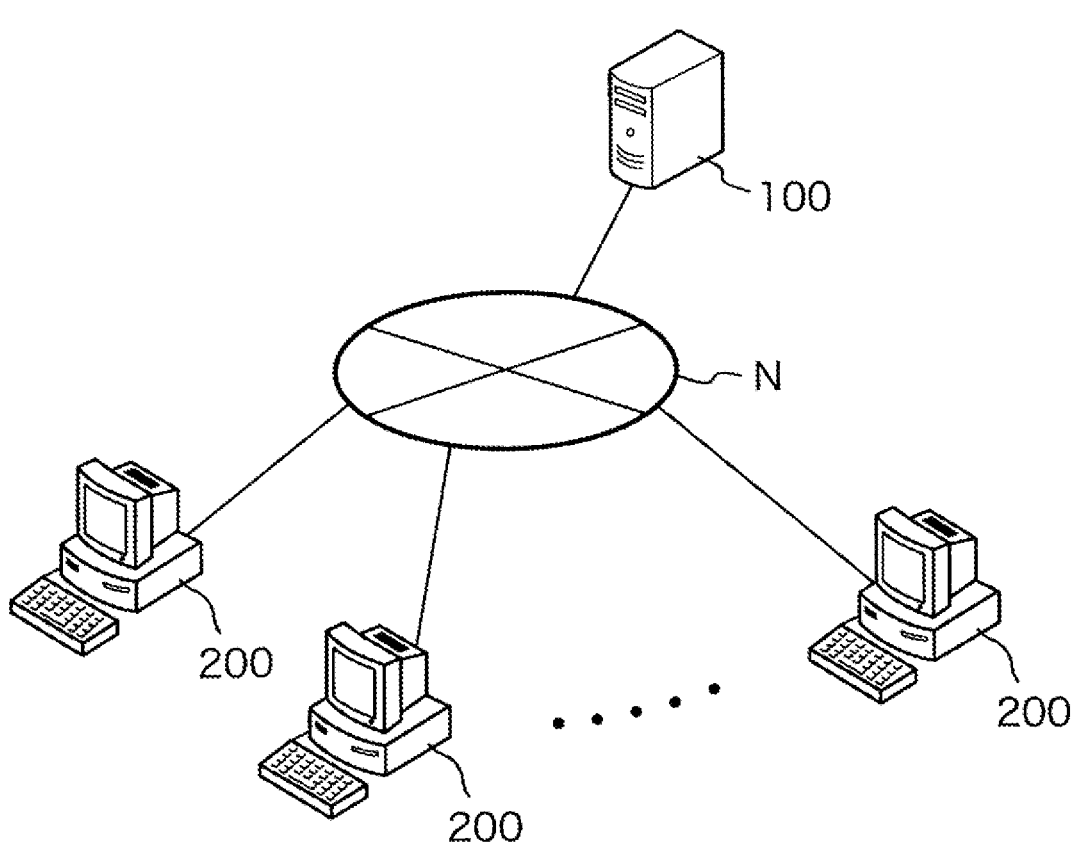
FIG. 1 is a block diagram for explaining an overall configuration of a development support system according to the present embodiment.

A development support apparatus includes: an estimation unit that estimates behavior of an energy storage device by using an equivalent circuit model reflecting a state of charge (SOC)-operating voltage characteristic in a high change-amount region where an amount of change in an operating voltage with respect to an amount of change in the SOC is relatively higher than in other regions among SOC-operating voltage characteristics during constant current charge and discharge of the energy storage device; and an output unit that outputs a result of an estimation by the estimation unit.

With this configuration, since the behavior of the energy storage device is estimated using the equivalent circuit model reflecting the SOC-operating voltage characteristic in the high change-amount region where the amount of change in the operating voltage with respect to the amount of change in the SOC is relatively higher than other regions, the behavior of the energy storage device can be accurately estimated, for example, even when the charge control in which charge and discharge are frequently repeated in the vehicle is performed. Furthermore, the rising characteristic of the polarization voltage in the high SOC region can be reflected in the equivalent circuit model, so that the current and voltage behavior corresponding to the polarization change at the end of charge can be relatively well reproduced.

In the development support apparatus, the equivalent circuit model may include a resistor that simulates a direct current (DC) resistance component of the energy storage device, a first RC parallel circuit that simulates a first polarization characteristic of the energy storage device showing a transient response characterized by a first time constant, and a second RC parallel circuit that simulates a second polarization characteristic of the energy storage device showing a transient response characterized by a second time constant larger than the first time constant, and respective values of a resistive device and a capacitive device included in the second RC parallel circuit may be set on the basis of the SOC-operating voltage characteristic in the high change-amount region. With this configuration, the rising characteristic of the polarization voltage in the high SOC region can be reflected in the equivalent circuit model, so that the current and voltage behavior corresponding to the polarization change at the end of charge can be relatively well reproduced.

In the development support apparatus, respective values of a resistive device and a capacitive device included in the first RC parallel circuit may be set on the basis of an SOC-operating voltage characteristic in a low change-amount region in which an amount of change in an operating voltage with respect to an amount of change in an SOC is relatively lower than other regions. With this configuration, a polarization characteristic that is stabilized at an early stage can be reflected in the equivalent circuit model.

A development support method using a computer includes: estimating behavior of an energy storage device by using an equivalent circuit model reflecting an SOC-operating voltage characteristic in a high change-amount region where an amount of change in an operating voltage with respect to an amount of change in the SOC is relatively higher than in other regions among SOC-operating voltage characteristics during constant current charge and discharge of the energy storage device; and outputting an estimation result of the behavior of the energy storage device.

With this configuration, since the behavior of the energy storage device is estimated using the equivalent circuit model reflecting the SOC-operating voltage characteristic in the high change-amount region where the amount of change in the operating voltage with respect to the amount of change in the SOC is relatively higher than other regions, the behavior of the energy storage device can be accurately estimated, for example, even when the charge control in which charge and discharge are frequently repeated in the vehicle is performed. Furthermore, the rising characteristic of the polarization voltage in the high SOC region can be reflected in the equivalent circuit model, so that the current and voltage behavior corresponding to the polarization change at the end of charge can be relatively well reproduced.

A state detection method using a computer includes estimating a battery state from a measured value of an energy storage device by using an equivalent circuit model reflecting an SOC-operating voltage characteristic in a high change-amount region where an amount of change in an operating voltage with respect to an amount of change in the SOC is relatively higher than in other regions among SOC-operating voltage characteristics during constant current charge and discharge of the energy storage device.

With this configuration, since the battery state of the energy storage device is estimated using the equivalent circuit model reflecting the SOC-operating voltage characteristic in the high change-amount region where the amount of change in the operating voltage with respect to the amount of change in the SOC is relatively higher than other regions, the battery state of the energy storage device can be accurately estimated, for example, even when the charge control in which charge and discharge are frequently repeated in the vehicle is performed. Furthermore, the rising characteristic of the polarization voltage in the high SOC region can be reflected in the equivalent circuit model, so that the battery state corresponding to the polarization change at the end of charge can be relatively well reproduced.

FIG. 1 is a block diagram for explaining an overall configuration of a development support system according to the present embodiment. The development support system according to the present embodiment includes a server apparatus 100 and client apparatuses 200, 200, . . . , 200 communicably connected to each other via a communication network N. In response to a request from the client apparatus 200, the server apparatus 100 simulates the behavior of the energy storage device and provides a simulation result to the client apparatus 200. Here, the energy storage device to be simulated includes a secondary battery such as a lead-acid battery or a lithium ion battery or a rechargeable energy storage device (cell) such as a capacitor. Alternatively, the energy storage device to be simulated may include a module in which a plurality of cells are connected in series, a bank in which a plurality of modules are connected in series, a domain in which a plurality of banks are connected in parallel, and the like.

The client apparatus 200 is a terminal apparatus such as a personal computer, a smartphone, or a tablet terminal used by a user. It is assumed that software (application program) for accessing the server apparatus 100 has been installed into the client apparatus 200. The server apparatus 100 performs user authentication based on, for example, a user ID and a password when receiving access from the client apparatus 200, and provides an appropriate service to the client apparatus 200 in a case where the user authentication is successful.

After the user authentication, the server apparatus 100 according to the present embodiment transmits, to the client apparatus 200, an interface screen for receiving various inputs by the user of the client apparatus 200. The interface screen includes, for example, a reception screen for receiving simulation conditions. The server apparatus 100 transmits a result of the simulation executed on the basis of the received conditions to the client apparatus 200.

The simulation result transmitted by the server apparatus 100 to the client apparatus 200 is data, such as numerical data or a graph, obtained as a simulation execution result.

In the present embodiment, the simulation conditions are received in the client apparatus 200, and the received simulation conditions and the like are transmitted to the server apparatus 100 to execute the simulation. Alternatively, a simulation program may be installed into the client apparatus 200 in advance, and the client apparatus 200 may receive simulation conditions, execute the simulation on the basis of the received simulation conditions and the like, and display a simulation result.

Figure 2:
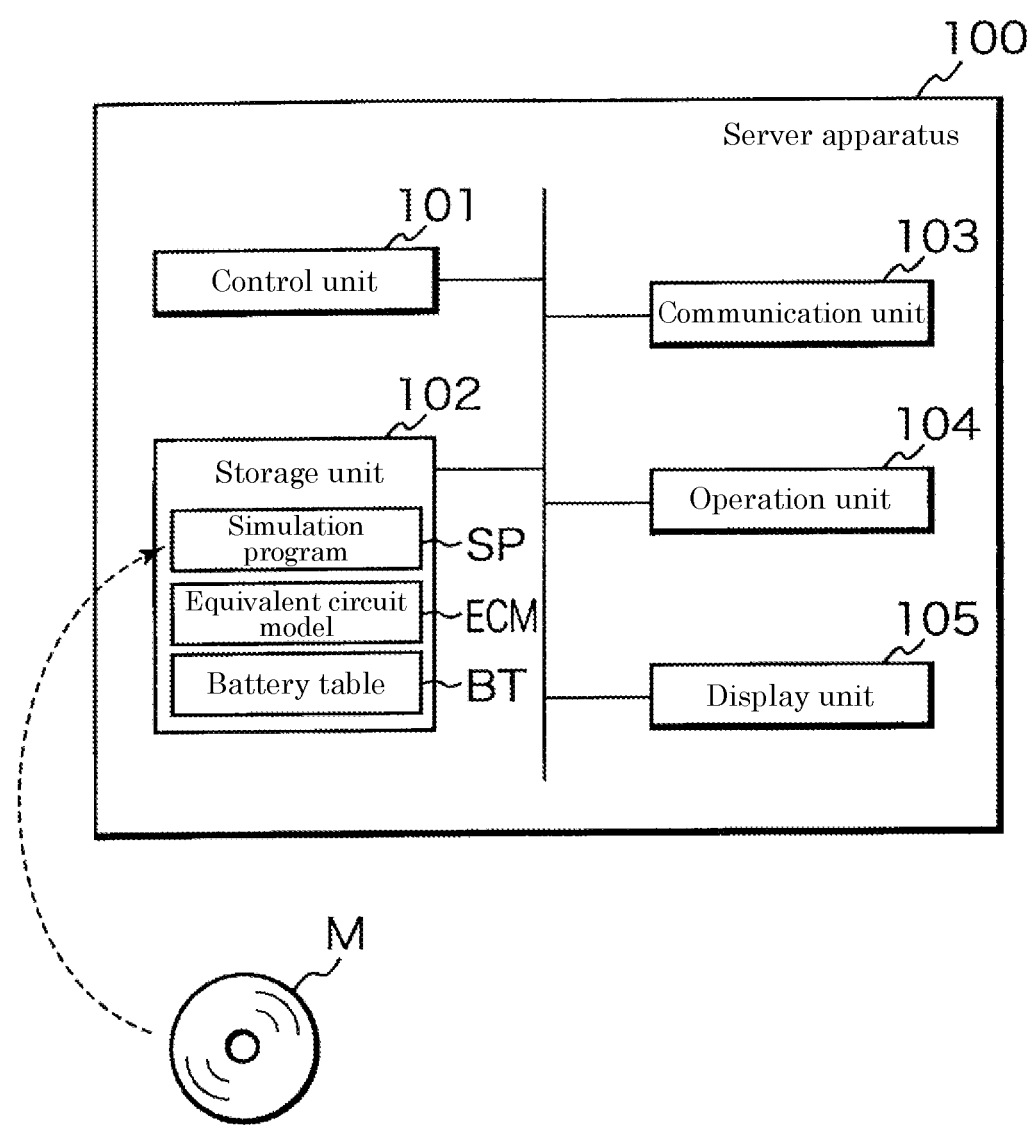
FIG. 2 is a block diagram for explaining an internal configuration of a server apparatus.

FIG. 2 is a block diagram for explaining the internal configuration of the server apparatus 100. The server apparatus 100 includes a control unit 101, a storage unit 102, a communication unit 103, an operation unit 104, and a display unit 105.

The control unit 101 is made up of a central processing unit (CPU), a read-only memory (ROM), a random-access memory (RAM), and the like. The CPU included in the control unit 101 causes the entire apparatus to function as the development support apparatus of the present application by developing various computer programs, stored in the ROM or the storage unit 102, on the RAM and executing the programs. Note that the server apparatus 100 is merely an embodiment of the development support apparatus and may be any information processing apparatus communicably connected to the client apparatus 200.

The control unit 101 is not limited to the above configuration but may be any processing circuit or arithmetic circuit including a plurality of CPUs, multi-core CPUs, graphics processing units (GPUs), microcomputers, volatile or non-volatile memories, and the like. Furthermore, the control unit 101 may have functions such as a timer that measures an elapsed time from when a measurement start instruction is given to when a measurement end instruction is given, a counter that counts the number, and a clock that outputs date and time information.

The storage unit 102 includes a storage apparatus including a hard disk drive (HDD), a solid-state drive (SSD), or the like. The storage unit 102 stores various computer programs that are executed by the control unit 101, data necessary for executing the computer programs, and the like. The computer program stored in the storage unit 102 includes a simulation program SP that simulates the behavior of the energy storage device. The simulation program SP is, for example, an execution binary. In the simulation program SP, an equivalent circuit model ECM that simulates the behavior of the energy storage device is used. Details of the equivalent circuit model ECM will be described later. Note that the simulation program SP may be a single computer program or a program group including a plurality of computers.

The program stored in the storage unit 102 may be provided by a non-transitory recording medium M into which the program has been recorded in a readable manner. The recording medium M is, for example, a portable memory such as a compact disc read-only memory (CD-ROM), a universal serial bus (USB) memory, a secure digital (SD) card, a micro-SD card, and a compact flash (registered trademark). In this case, the control unit 101 reads the program from the recording medium M by using a reading apparatus (not illustrated) and installs the read program into the storage unit 102. Furthermore, the program stored in the storage unit 102 may be provided by communication via the communication unit 103. In this case, the control unit 101 acquires the program through the communication unit 103 and installs the acquired program into the storage unit 102.

The storage unit 102 stores the equivalent circuit model ECM of the energy storage device used in the simulation. The equivalent circuit model ECM is described by configuration information indicating a circuit configuration, values of the respective devices constituting the equivalent circuit model ECM, and the like. The storage unit 102 stores the configuration information indicating the circuit configuration of the equivalent circuit model ECM, the values of the respective devices constituting the equivalent circuit model ECM, and the like as described above.

Furthermore, the storage unit 102 may have a battery table BT that stores information on the energy storage device (battery) in association with the user ID. The battery table BT stores, for example, a battery ID for identifying a battery, a user ID for identifying a user, and battery information in association with each other. The battery information registered in the battery table BT includes, for example, information on a positive electrode and a negative electrode, information on an electrolyte solution, information on a tab, and the like. The information on the positive electrode and the negative electrode is information such as active material names, thicknesses, widths, depths, and open circuit potentials of the positive electrode and the negative electrode. The information of the electrolyte solution and the tab is information such as ion species, transport number, diffusion coefficient, and conductivity. In addition, the battery table BT may include a link that refers to information such as physical properties, an operation state, and a circuit configuration of the energy storage device. The information stored in the battery table BT may be registered by the administrator of the server apparatus 100 or may be registered by the user via the client apparatus 200. The information stored in the battery table BT is used as a part of parameters at the time of simulating the behavior of the energy storage device.

The communication unit 103 includes an interface for communicating with the client apparatus 200 through the communication network N. When receiving an input of information to be transmitted to the client apparatus 200 from the control unit 101, the communication unit 103 transmits the input information to the client apparatus 200 and outputs information from the client apparatus 200 received through the communication network N to the control unit 101.

The operation unit 104 includes an input interface, such as a keyboard, a mouse, and a touch panel, and receives an operation by the user. The display unit 105 includes a liquid crystal display apparatus and the like and displays information to be notified to the user. In the present embodiment, the server apparatus 100 includes the operation unit 104 and the display unit 105, but the operation unit 104 and the display unit 105 are not essential. An operation may be received through a computer connected to the outside of the server apparatus 100, and information to be notified is output to the external computer.

Figure 3:
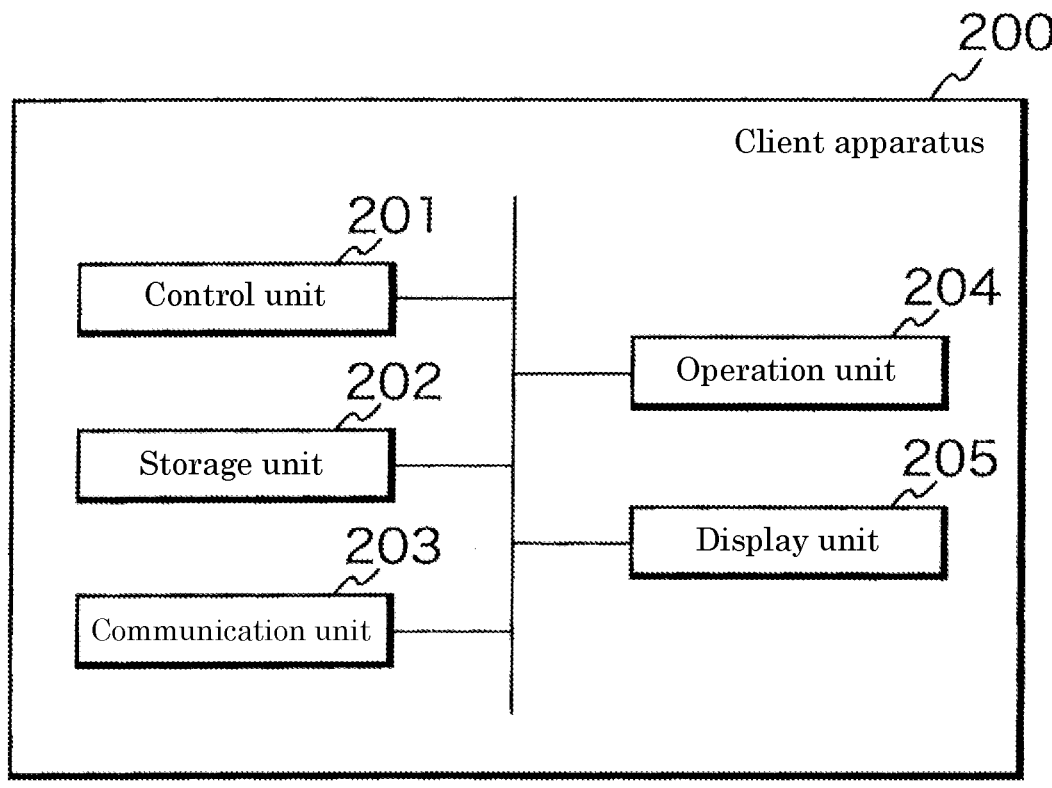
FIG. 3 is a block diagram for explaining an internal configuration of a client apparatus.

FIG. 3 is a block diagram for explaining an internal configuration of the client apparatus 200. The client apparatus 200 is a personal computer, a smartphone, a tablet terminal, or the like, and includes a control unit 201, a storage unit 202, a communication unit 203, an operation unit 204, and a display unit 205.

The control unit 201 is made up of a CPU, a ROM, a RAM, and the like. The CPU included in the control unit 201 performs the control of the entire apparatus by developing various computer programs, stored in the ROM or the storage unit 202, on the RAM and executing the programs.

The control unit 201 is not limited to the above configuration but may be any processing circuit or arithmetic circuit including a plurality of CPUs, multi-core CPUs, microcomputers, and the like. Furthermore, the control unit 201 may have functions such as a timer that measures an elapsed time from when a measurement start instruction is given to when a measurement end instruction is given, a counter that counts the number, and a clock that outputs date and time information.

The storage unit 202 includes a nonvolatile memory such as an electrically erasable programmable read-only memory (EEPROM) and stores various computer programs and data. The computer program stored in the storage unit 202 includes a general-purpose or dedicated application used for exchanging information with the server apparatus 100. An example of the general-purpose application program is a web browser. In a case where the server apparatus 100 is accessed using the web browser, user authentication is preferably performed using the user ID and authentication code, and communication between the server apparatus 100 and the client apparatus 200 may be permitted only when the user authentication is successful.

The communication unit 203 includes an interface for communicating with the server apparatus 100 through the communication network N. When receiving an input of information to be transmitted to the server apparatus 100 from the control unit 201, the communication unit 203 transmits the input information to the server apparatus 100 and outputs information from the server apparatus 100 received through the communication network N to the control unit 201.

The operation unit 204 includes an input interface, such as a keyboard, a mouse, and a touch panel, and receives an operation by the user. The display unit 205 includes a liquid crystal display apparatus and the like and displays information to be notified to the user. In the present embodiment, the client apparatus 200 includes the operation unit 204, but an input interface such as a keyboard or a mouse may be connected to the client apparatus 200.

Hereinafter, the equivalent circuit model ECM used for simulating the behavior of the energy storage device in the server apparatus 100 will be described.

Figure 4:
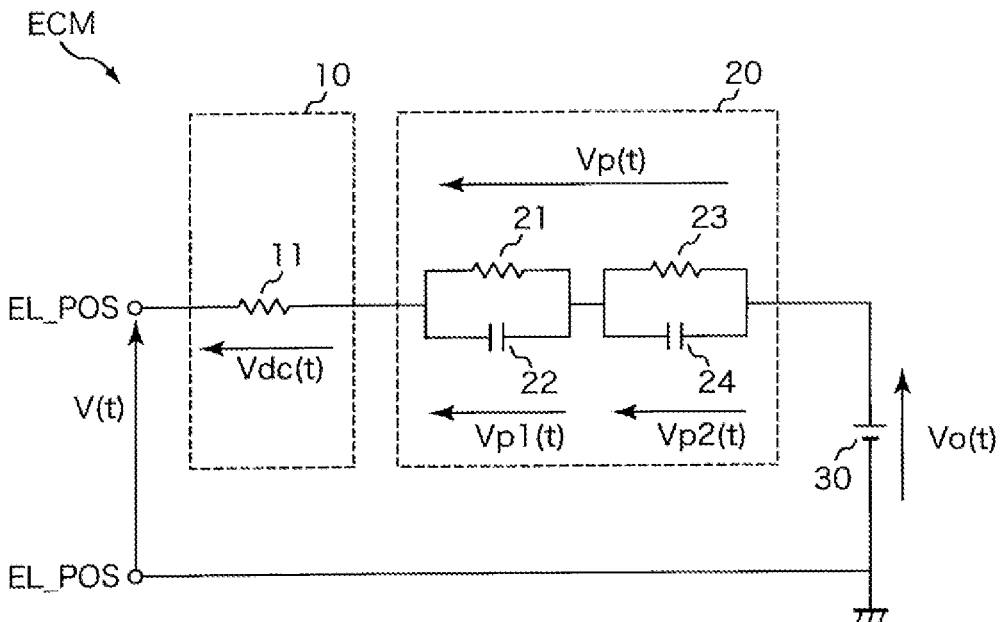
FIG. 4 is a circuit diagram illustrating an example of an equivalent circuit model of an energy storage device.

FIG. 4 is a circuit diagram illustrating an example of the equivalent circuit model ECM of the energy storage device. The equivalent circuit model ECM illustrated in FIG. 4 as an example is a model when a lead-acid battery is used as the energy storage device, and includes circuit units 10, 20, connected in series between a positive electrode terminal EL-POS and a negative electrode terminal EL-NEG, and a constant voltage source 30.

The positive electrode terminal EL-POS and the negative electrode terminal EL-NEG are terminals electrically connected to an external element of the energy storage device and apply a voltage generated in the equivalent circuit model ECM. The voltage generated in the equivalent circuit model ECM is represented by a terminal voltage V(t) of the energy storage device varying in accordance with a time t. Here, the time t represents an elapsed time from the start of the simulation.

The circuit unit 10 is a circuit unit for simulating a DC resistance component (DC impedance) of the energy storage device. The circuit unit 10 includes a resistive device 11. Examples of the DC resistance component of the energy storage device include resistance of an electrode. The resistance value of the resistive device 11 is a value that changes depending on a discharge current, a charge voltage, an SOC, a temperature, and the like. When the impedance of the circuit unit 10 is determined, it is possible to calculate the voltage generated in the circuit unit 10 when the current I(t) flows through the equivalent circuit model ECM. The voltage generated in the circuit unit 10 is defined as a DC resistance voltage Vdc(t).

The circuit unit 20 is a circuit unit for simulating transient polarization characteristic of the energy storage device. The circuit unit 20 includes an RC parallel circuit including a resistive device and a capacitive device connected in parallel. In the equivalent circuit model ECM according to the present embodiment, two RC parallel circuits are connected in series. Specifically, a first RC parallel circuit, in which a resistive device 21 and a capacitive device 22 are connected in parallel, and a second RC parallel circuit, in which a resistive device 23 and a capacitive device 24 are connected in parallel, are connected in series.

The resistance value of the resistive device 21 which constitutes the first RC parallel circuit and the capacitance value of the capacitive device 22 which constitutes the first RC parallel circuit are given as values that vary in accordance with the SOC of the energy storage device. The resistive device 21 represents a first polarization resistance component of the energy storage device, and the capacitive device 22 represents a first polarization capacitance component of the energy storage device.

Similarly, the resistance value of the resistive device 23 which constitutes the second RC parallel circuit and the capacitance value of the capacitive device 24 which constitutes the second RC parallel circuit are given as values that vary in accordance with the SOC of the energy storage device. The resistive device 23 represents a second polarization resistance component of the energy storage device, and the capacitive device 24 represents a second polarization capacitance component of the energy storage device.

The impedance of the circuit unit 20 is determined by the resistance values of the resistive devices 21, 23 which constitute the circuit unit 20 and the capacitance values of the capacitive devices 22, 24 which constitute the circuit unit 20. When the impedance of the circuit unit 20 is determined, it is possible to calculate the voltage generated in the circuit unit 20 when the current I(t) flows through the equivalent circuit model ECM. The voltage generated in the circuit unit 20 is defined as a polarization voltage Vp(t). The polarization voltage Vp(t) is a total voltage of a polarization voltage Vp1(t) generated in the first RC parallel circuit and a polarization voltage Vp2(t) generated in the second RC parallel circuit.

Here, a time constant in the first RC parallel circuit is $\tau1$, and a time constant in the second RC parallel circuit is $\tau2$. The time constant $\tau1$ is determined as a value obtained by multiplying the resistance value of the resistive device 21 and the capacitance value of the capacitive device 22 constituting the first RC parallel circuit. The time constant $\tau1$ is reflected in a temporal change of the polarization voltage Vp1(t) generated in the first RC parallel circuit. Similarly, the time constant $\tau2$ is determined as a value obtained by multiplying the resistance value of the resistive device 23 and the capacitance value of the capacitive device 24 constituting the second RC parallel circuit. The time constant $\tau2$ is reflected in a temporal change of the polarization voltage Vp2(t) generated in the second RC parallel circuit. In the present embodiment, it is assumed that the relationship of time constant $\tau1$<time constant $\tau2$ is satisfied.

The constant voltage source 30 is a voltage source that outputs a DC voltage. The voltage output from the constant voltage source 30 is an open-circuit voltage (OCV) of the energy storage device and is described as Vo(t). The open-circuit voltage Vo(t) is given, for example, as a function of the SOC. The open-circuit voltage Vo(t) may also be given as a function of the temperature of the energy storage device or the like.

The terminal voltage V(t) generated in the equivalent circuit model ECM described above can be written as follows by using the DC resistance voltage Vdc(t), the polarization voltage Vp(t), and the open-circuit voltage Vo(t):

$$V(t)=Vdc(t)+Vp(t)+Vo(t)$$

As a method for setting a value (hereinafter referred to as a circuit parameter) of each device constituting the equivalent circuit model ECM, in the present embodiment, a method for setting a circuit parameter while considering a relationship with a current, an SOC, or the like on the basis of an actual measurement result to be described later was used.

In an energy storage device including a lead-acid battery, considering that there is a linear relationship between the electromotive force (the open-circuit voltage Vo(t) described above) and the concentration of sulfuric acid, which is the electrolyte solution of the battery, and that the sulfuric acid concentration corresponds to the SOC, the electromotive force of the energy storage device can be described as Formula (1) below.

$$Vo(t)=Ka\times(SOC)+Kb \qquad (1)$$

Here, for Ka and Kb, coefficients determined by the liquid amount, the sulfuric acid concentration, the battery capacity at full charge, and the like were set. The SOC used in the equivalent circuit model ECM was calculated based on the battery capacity and the integrated amount of electricity at full charge.

Note that the open-circuit voltage Vo(t) may be set by further taking into account a voltage variation caused by a side reaction.

The battery voltage during actual charge and discharge indicates a value different from the electromotive force given at Vo. The difference between this electromotive force and the actual battery voltage is described as polarization. In the present embodiment, the polarization characteristic is simulated by combining the first RC parallel circuit and the second RC parallel circuit in the equivalent circuit model ECM as illustrated in FIG. 4.

Hereinafter, a description will be given of actual measurement characteristics used for deriving a resistance value R1 of the resistive device 21 which constitutes the first RC parallel circuit and a capacitance value C1 of the capacitive device 22 which constitutes the first RC parallel circuit and a resistance value R2 of the resistive device 23 which constitutes the second RC parallel circuit and a capacitance value C2 of the capacitive device 24 which constitutes the second RC parallel circuit.

FIG. 5 is a table for explaining conditions of various tests. In the present embodiment, a target battery is, for example, a 12 V battery (M-42, a rated capacity of 32 Ah) for an idling stop vehicle, and various characteristics were acquired by performing Test A and Test B illustrated in the table of FIG. 5. Test A is a test performed for the purpose of examining the relationship between the voltage current transition that is stabilized with an SOC variation of several percent after the start of charge-discharge and each charge-discharge condition. On the other hand, Test B is a test performed for the purpose of examining the relationship between the voltage transition including an extreme SOC region such as complete discharge or full charge and each charge-discharge condition. In the table illustrated in FIG. 5, $I_5$ is 6.4 A.

In the present embodiment, the value of each device of the circuit unit 20 was set in consideration of polarization (hereinafter referred to as polarization 1) that is stabilized with an SOC variation of about several percent after the start of charge or discharge and polarization (hereinafter referred to polarization 2) corresponding to a dramatic behavior change in low SOC and high SOC regions. The polarization 1 is considered to be related to electric double-layer capacitance and the like in the vicinity of the plate and was simulated by the first RC parallel circuit having a relatively small time constant (time constant τ1). On the other hand, the polarization 2 is considered to be related to a change in plate structure, a change in side reaction amount, and the like and was simulated by the second RC parallel circuit having a relatively large time constant (time constant τ2) and set in consideration of SOC characteristics.

Figure 6:
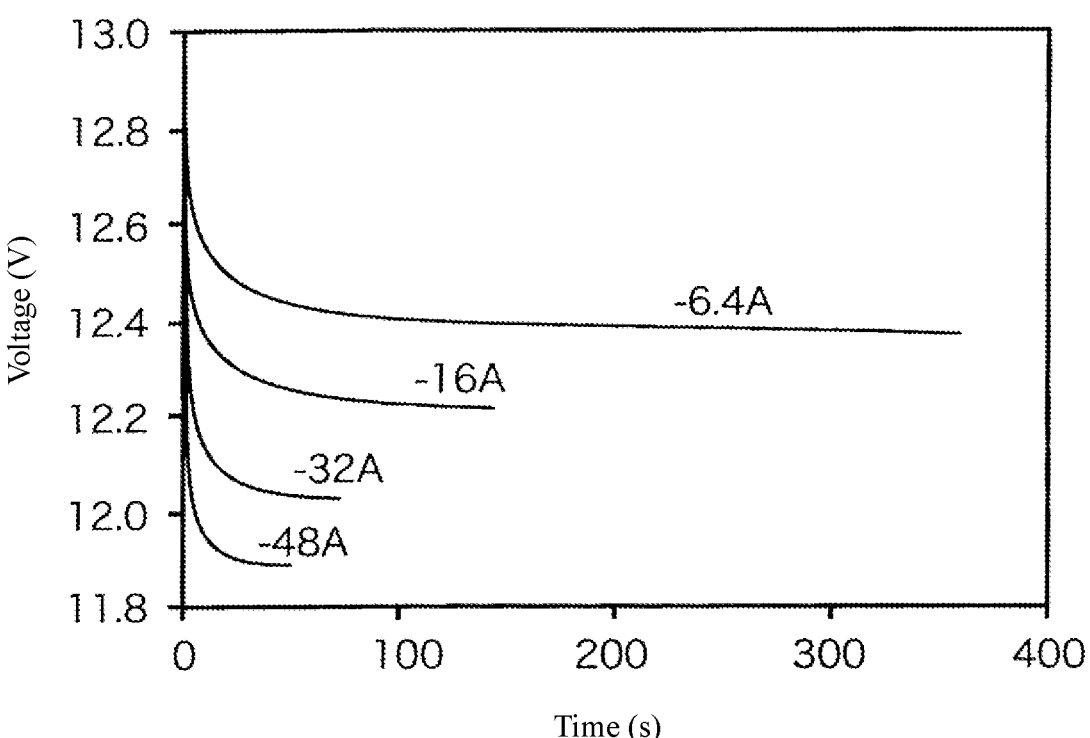
FIG. 6 is a graph illustrating a test result of Test A.

FIG. 6 is a graph illustrating a test result of Test A. The horizontal axis of the graph represents the time(s), and the vertical axis represents the voltage (V). The graph of FIG. 6 illustrates the temporal transition of the voltage when the discharge current is changed variously. According to the test result of Test A, a characteristic relating to the polarization 1 that is stabilized early is extracted. In general, a terminal voltage $V_{RC}(t)$ of the RC parallel circuit at time t is expressed by Formula (2) below using a current I, a resistance value R of the resistive device, and a capacitance value C of the capacitive device.

$$V_{RC}(t)=I\times R\times(1-e^{-t/RC}) \qquad (2)$$

Since $V_{RC}\approx I\times R$ when time t is sufficiently large, the resistance value R under each current condition can be calculated by assuming that the charge-discharge voltage at the time of performing Test A is in a steady state. Furthermore, in general, in the RC parallel circuit, a time at which time $t=R\times C$ is satisfied is a time constant t, it can be seen from Formula (2) that the relationship of $V_{RC}C$ (τ)≈I×R× 0.63 holds at this time. By using this characteristic, the time constant t can be obtained from the actual voltage variation, and the capacitance value C can be obtained by further dividing the time constant τ by the previous resistance value R. In this manner, the resistance value R1 of the resistive device 21, the capacitance value C2 of the capacitive device 22, and the time constant τ1 constituting the first RC parallel circuit can be calculated.

Figure 7:
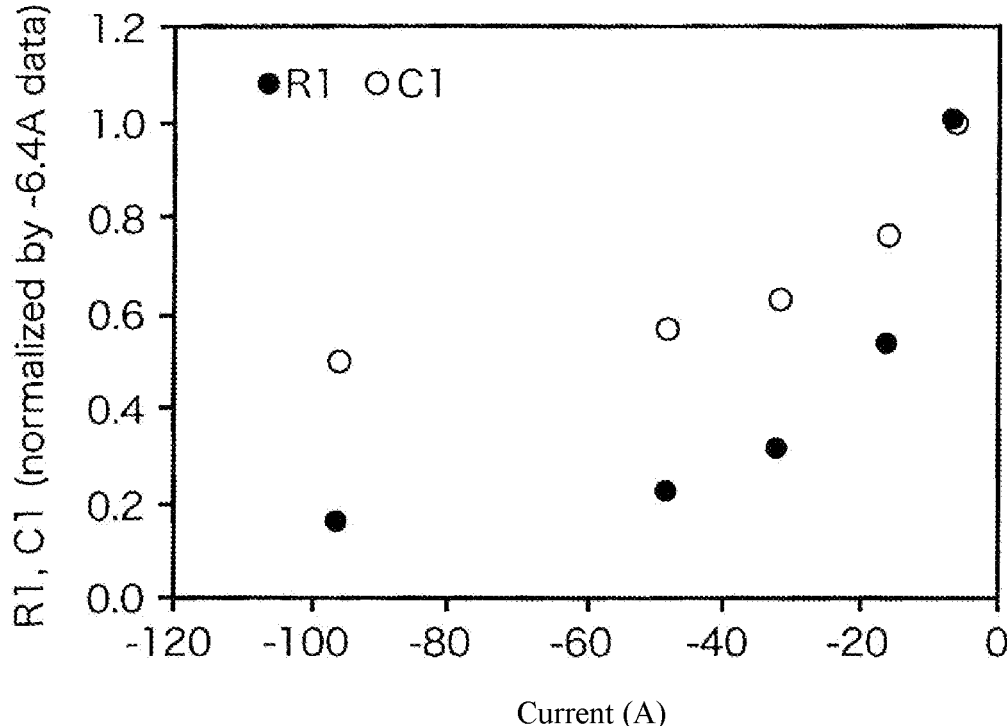
FIG. 7 is a graph illustrating current characteristics of circuit parameters obtained for the first RC parallel circuit.

FIG. 7 is a graph illustrating current characteristics of circuit parameters obtained for the first RC parallel circuit. In the graph of FIG. 7, the horizontal axis represents the value of the discharge current, and the vertical axis represents the resistance value R1 and the capacitance value C1. Here, the resistance value R1 and the capacitance value C1 indicate values obtained by normalizing the discharge current with a value of −6.4 A.

Figure 8:
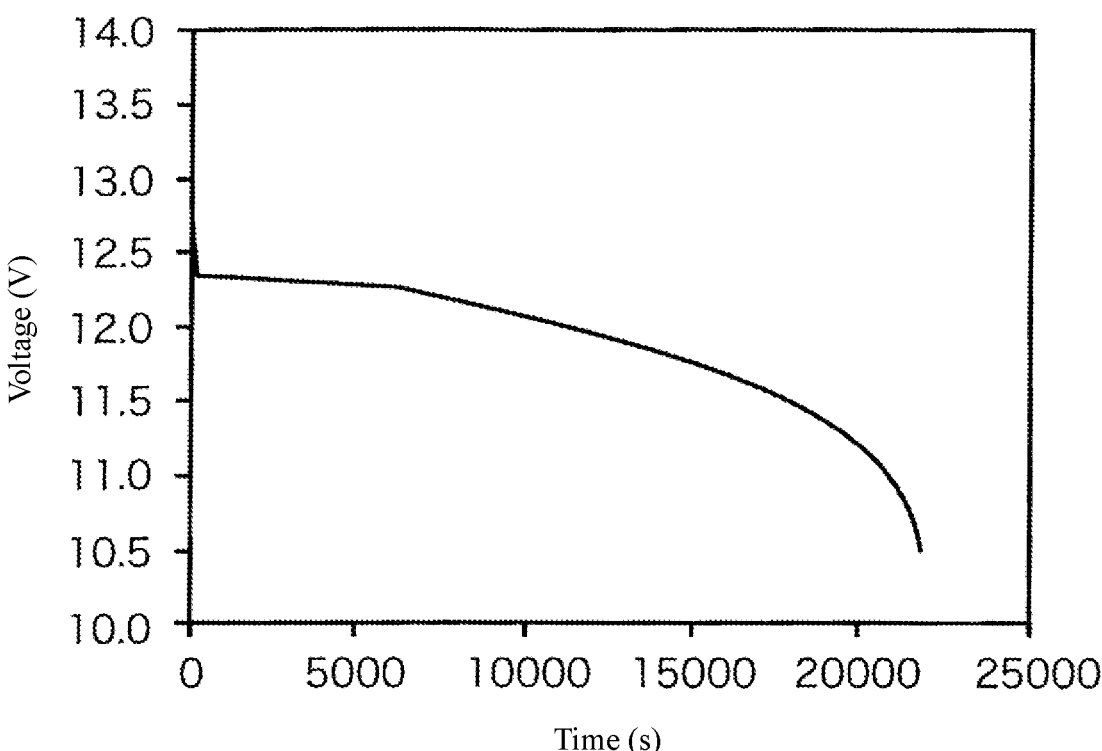
FIG. 8 is a graph illustrating a test result of Test B.

FIG. 8 is a graph illustrating a test result of Test B. The horizontal axis of the graph represents the time (s), and the vertical axis represents the operating voltage (V), and an example of voltage transition including an extreme SOC region such as full charge or complete discharge. In the present embodiment, the resistance value R2 of the resistive device 23 depending on the SOC was calculated using the SOC-operating voltage characteristic in an extreme SOC region such as full charge or complete discharge (i.e., the high change-amount region in which the amount of change in the operating voltage with respect to the amount of change in the SOC is relatively higher than other regions) with reference to the result of Test B as illustrated in FIG. 8.

Figure 9:
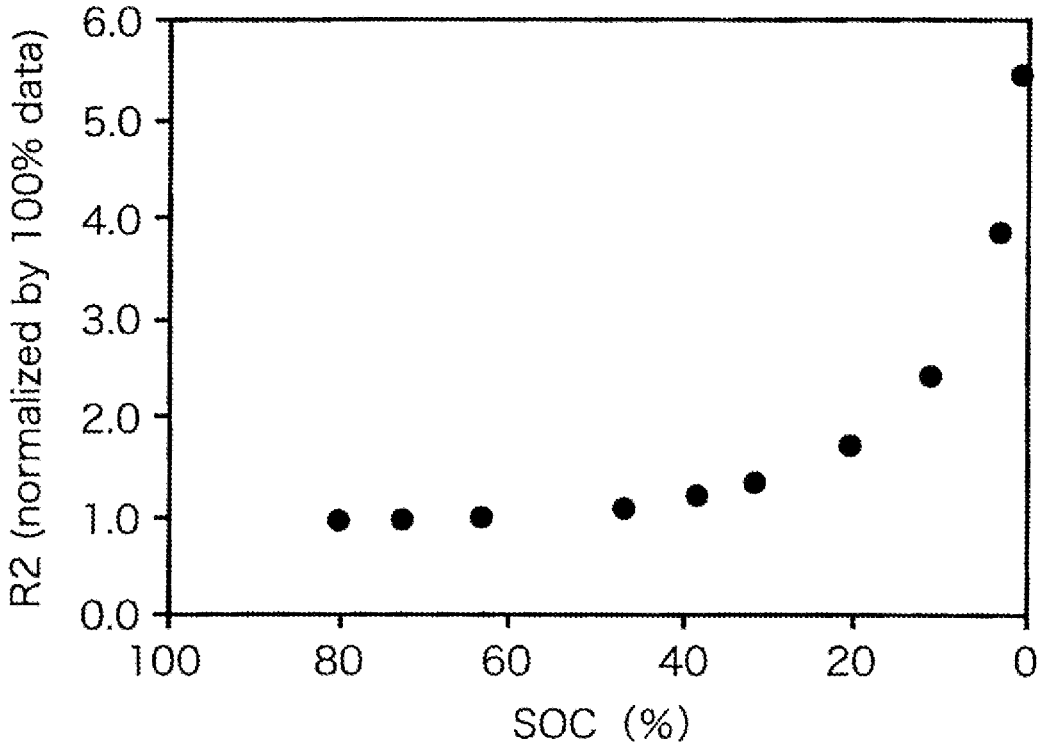
FIG. 9 is a graph illustrating SOC dependency of a resistance value obtained for a resistive device.

FIG. 9 is a graph illustrating the SOC dependency of the resistance value R2 obtained for the resistive device 23. The horizontal axis of the graph represents SOC (%), and the vertical axis represents the value of the resistance value R2. Here, the resistance value R2 indicates a value normalized by the SOC value of 100%. Note that the capacitance value C2 of the capacitive device 24 in the second RC parallel circuit was set in a range of a coefficient multiple of the capacitance value C1 (here, the coefficient is a value of 1 to 10) by using the function of the SOC.

Furthermore, the resistance value R0 of the resistive device 11 representing the instantaneous polarization characteristic can be read from, for example, instantaneous voltage variation during high-rate discharge, and in the present embodiment, the resistance value R0 was calculated on the basis of the experimental result of Test A.

In the present embodiment, in the server apparatus 100, the equivalent circuit model ECM was described using VHDL-AMS. This VHDL-AMS can be handled in a multi-domain simulation, in which machine, heat, electricity, hydraulic pressure, electrochemistry, and the like are integrated, and is a kind of computer language that can be used widely.

The generated equivalent circuit model ECM is connected to a verifying circuit (not illustrated), and the current behavior when a verification pattern is input is compared with the measured value, whereby the appropriateness of the model can be verified. As the verification pattern, a charge-discharge pattern created so as to make the charge-discharge switching cycle shorter than that in the SBA-IS test was prepared. Such a charge-discharge pattern is created by simulating, for example, a result of an actual vehicle test performed independently in a city where the start and stop occur frequently. In the verification pattern, the current voltage range was set with reference to the test conditions of the SBA-IS test, and after the initial SOC was adjusted to 90%, the charge and discharge test was performed to measure the temporal change of the current.

Figure 10:
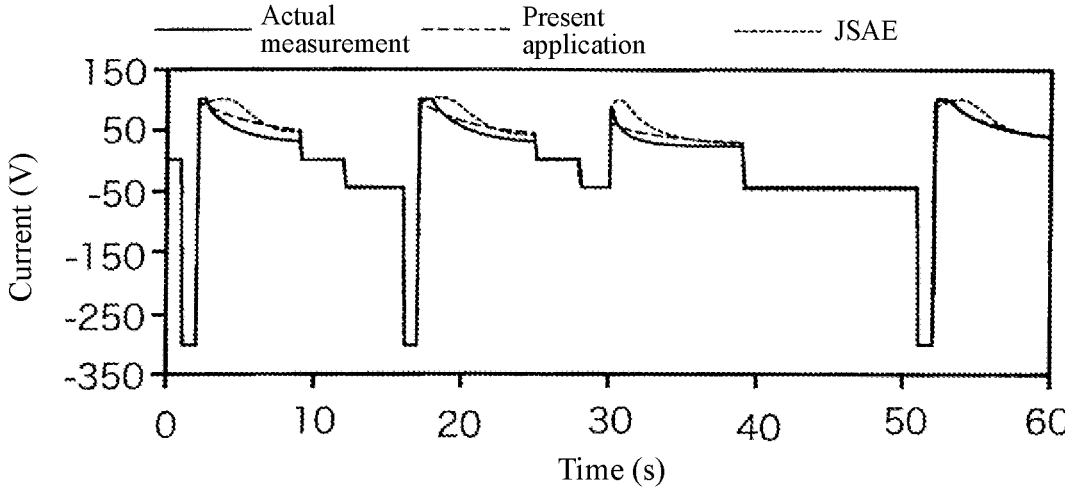
FIG. 10 is a graph illustrating an example of a verification result.
Figure 11:
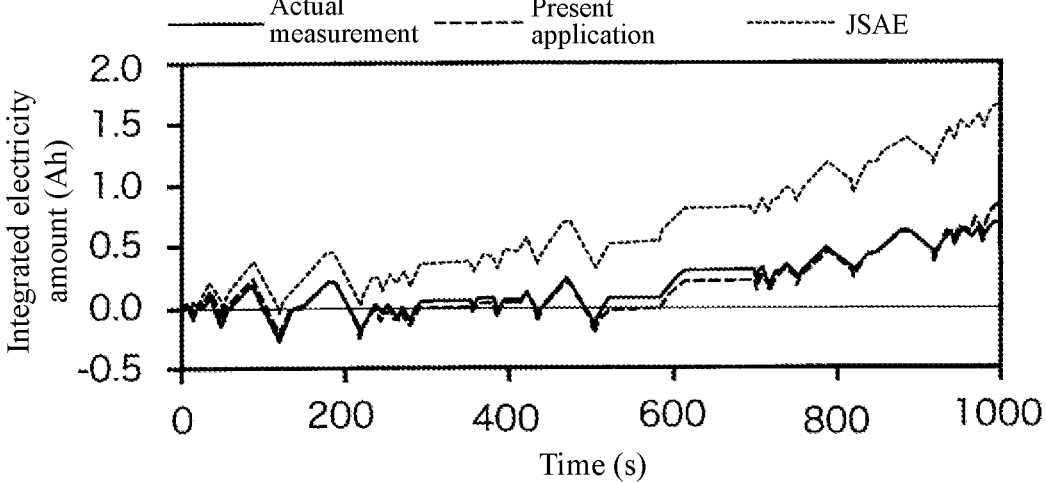
FIG. 11 is a graph illustrating an example of a verification result.

FIGS. 10 and 11 are graphs each illustrating an example of a verification result. The horizontal axis of the graph illustrated in FIG. 10 represents the elapsed time (s) from the start of the simulation, and the vertical axis represents current (A). Similarly, the horizontal axis of the graph illustrated in FIG. 11 represents the elapsed time (s) from the start of the simulation, and the vertical axis represents the integrated amount of electricity (Ah). In each of FIGS. 10 and 11, a measured value is indicated by a solid line, and a simulation result using the equivalent circuit model ECM of the present application and a simulation result using a model of JSAE (hereinafter referred to as a JSAE model) are indicated by different broken lines.

As illustrated in FIGS. 10 and 11, in the equivalent circuit model ECM according to the present application, it has been possible to improve the estimation accuracy of the behavior as compared to the conventional JSAE model. In particular, it has been found that the mean error of the integrated amount of electricity has been reduced to about ⅙ as compared to the JSAE model in the charge-discharge pattern as described above in which charge and discharge can occur frequently. The mean error was calculated using root means square error (EMSE) expressed by Formula (3) below and using each data every 0.1 seconds.

[Math. 1]

$$RMSE = \sqrt{\frac{1}{n}\sum_{i=1}^{n}(f_i - y_i)^2} \qquad (3)$$

Here, n is the number of data, $f_i$ is a predicted value, and $y_i$ is a measured value.

In the equivalent circuit model ECM of the present application, the voltage rise immediately after the charge is faster than that in the JSAE model, and the behavior is closer to the actual measurement.

Here, focusing on the temporal variation of the current, a phenomenon was seen in which the measured current droops early after reaching the limited current, whereas in the JSAE model, the limited current flows for a certain period of time and then shifts to a current droop. As in the actual measurement, the influence of the immediately preceding discharge polarization is considered as a cause of early drooping of the charge current in frequent charge and discharge. For example, considering that the voltage at the start of charge is a combination of a decrease in discharge polarization and an increase in charge polarization, in a case where the amount of charge immediately before the charge is small, the discharge polarization becomes small, so that the voltage at the start of charge is likely to be affected by the increase in charge polarization, and the voltage is assumed to rise early. In the model creation of the present application, the polarization characteristic in the high SOC region is considered by reflecting the SOC characteristic obtained in Test B in the model. That is, it is considered that the accurate reproduction of the temporal variations of the current and the integrated amount of current has been possible because the design was made so as to enable more accurate reproduction of the increase in charge polarization based on the above characteristic.

Figure 12:
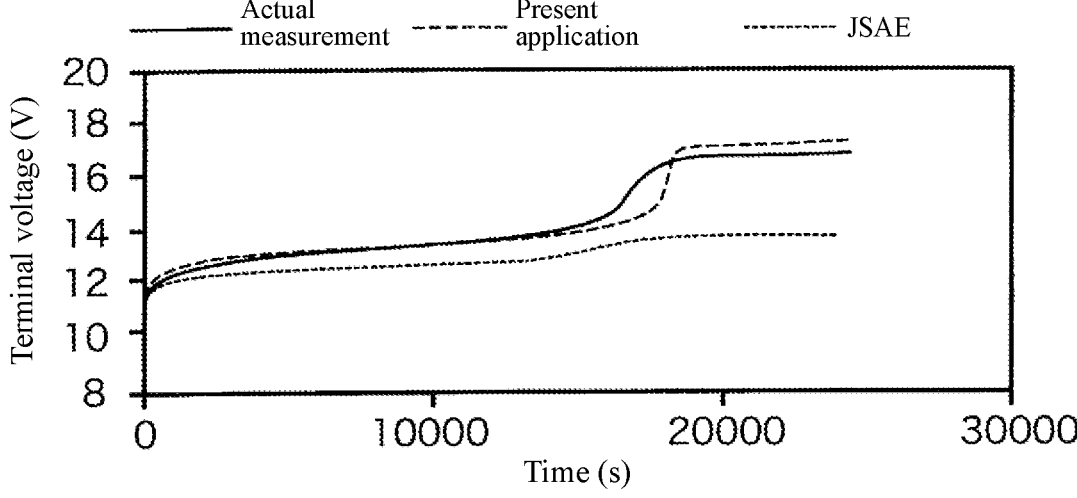
FIG. 12 is a graph illustrating another example of the verification result.

FIG. 12 is a graph illustrating another example of the verification result. The horizontal axis of the graph illustrated in FIG. 12 represents the elapsed time (s) from the start of the simulation, and the vertical axis represents the terminal voltage V. As illustrated in FIG. 12, in the conventional JSAE model, the voltage generally transits at a low level, and in particular, converges without rising at the end of charge, whereas in the equivalent circuit model ECM of the present embodiment, the reproduction has been possible relatively well, including the voltage rise at the end of charge.

It is known that the rise of the polarization voltage at the end of charge in the lead-acid battery is mainly derived from a side reaction in the negative electrode, and the amount of the side reaction changes depending on the charge voltage. In an actual vehicle, charge control is performed in consideration of the amount of the side reaction, but the control varies depending on the vehicle. Since the equivalent circuit model ECM in the present embodiment considers the side reaction amount, it has become possible to output an appropriate behavior for various charge control.

In response to a request from the client apparatus 200, the control unit 101 of the server apparatus 100 simulates the temporal variation of the current, the integrated current value, and the like by using the equivalent circuit model ECM as described above and transmits the simulation result to the client apparatus 200, thereby performing development support. Alternatively, the control unit 101 may simulate the temporal variation of the terminal voltage or the like by using the equivalent circuit model ECM and transmit the simulation result to the client apparatus 200.

Note that the values of the respective devices (resistive device 11, resistive device 21, resistive device 31, capacitive device 22, and capacitive device 24) included in the circuit unit 10 and the circuit unit 20 may be set in consideration of the charge-discharge balance of the energy storage device before the time at which the simulation is started. For example, the resistance values of the resistive device 21 and the resistive device 31 and the capacitance values of the capacitive device 22 and the capacitive device 24 included in the circuit unit 20 may be set in consideration of a correction coefficient determined with reference to a series of SOC variations and charge and discharge balances so as to follow the characteristics of the actual battery that change in accordance with the immediately preceding state.

In addition, since polarization due to a side reaction changes depending on a charge voltage, an upper limit may be set for a resistance value representing polarization on the basis of a charge voltage-polarization voltage (maximum value) characteristic. In this case, it is possible to perform control so as not to excessively increase the resistance in the high SOC region, and it is possible to create a more accurate model.

Figure 13:
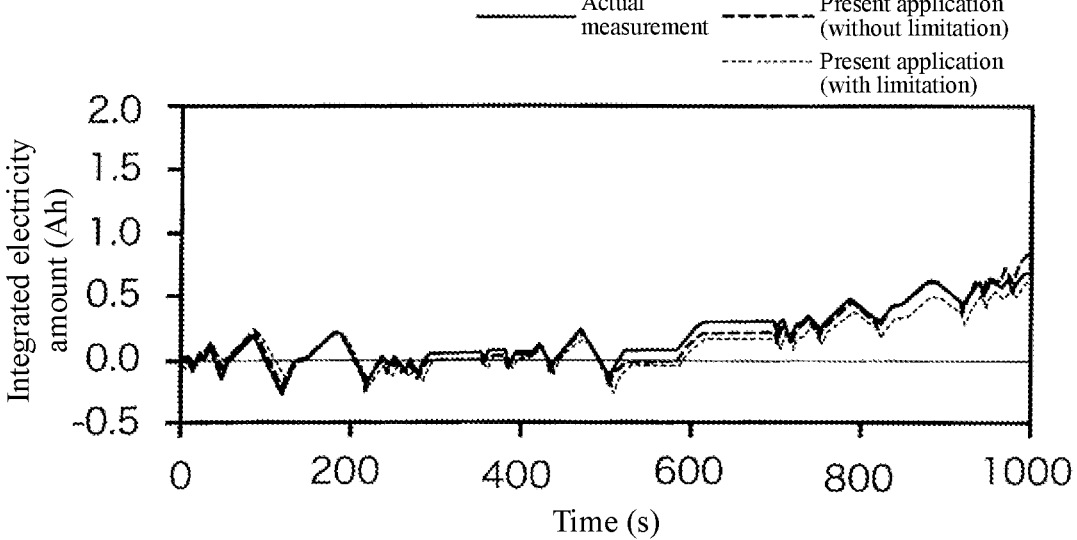
FIG. 13 is a graph illustrating a verification result in the case of setting an upper limit for a resistance value.
Figure 14:
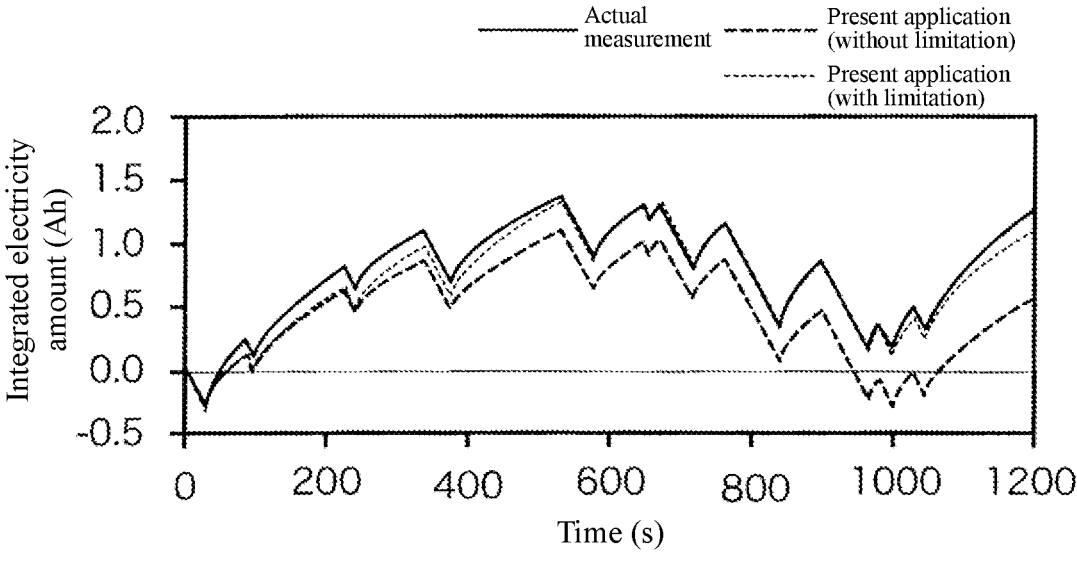
FIG. 14 is a graph illustrating a verification result in the case of setting the upper limit for the resistance value.

FIGS. 13 and 14 are graphs illustrating verification results when an upper limit was set for the resistance value. FIG. 13 illustrates a verification result when the same charge-discharge pattern as those in FIGS. 10 and 11 were input, where the horizontal axis represents the elapsed time (s) from the start of the simulation, and the vertical axis represents the integrated amount of electricity (Ah). It can be seen that the actual measurement has been reproduced with relatively high accuracy in both a case where the upper limit was not set for the resistance value expressing the polarization (a case without a limitation) and a case where the upper limit was set (a case with a limitation).

FIG. 14 illustrates a verification result when a charge-discharge pattern having a lower frequency of charge-discharge than the charge-discharge pattern illustrated in FIG. 10 was input, where the horizontal axis represents the elapsed time (s) from the start of the simulation, and the vertical axis represents the integrated amount of electricity (Ah). By setting the upper limit for the resistance value expressing the polarization (the case with a limitation), it has become possible to improve the accuracy in the actual measurement reproduction as compared to the case where the upper limit was not set for the resistance value (the case without a limitation).

The presently disclosed embodiment is illustrative in all respects and should not be considered as limiting. The scope of the present invention is illustrated by the claims rather than the meanings described above and is intended to include meanings equivalent to the claims and all modifications within the claims.

DESCRIPTION OF REFERENCE SIGNS

100: server apparatus
101: control unit
102: storage unit
103: communication unit
104: operation unit
105: display unit
200: client apparatus
201: control unit
202: storage unit
203: communication unit
204: operation unit
205: display unit
N: communication network

The invention claimed is:

1. A development support apparatus comprising:
an estimation unit that estimates behavior of an energy storage device by using an equivalent circuit model reflecting a state of charge (SOC)-operating voltage characteristic during constant current charge and discharge of the energy storage device in a high change-amount region where an amount of change in an operating voltage with respect to an amount of change in a SOC of the energy storage device is relatively higher than in other regions among SOC-operating voltage characteristics during constant current charge and discharge of the energy storage device; and
an output unit that outputs a result of an estimation by the estimation unit,
wherein the energy storage device is a lead-acid battery,
the SOC-operating voltage characteristic includes a first polarization characteristic and a second polarization characteristic,
the equivalent circuit model includes
a resistor that simulates a direct current (DC) resistance component of the energy storage device,
a first RC parallel circuit that simulates the first polarization characteristic of the energy storage device showing a transient response during constant current charge and discharge of the energy storage device characterized by a first time constant, and
a second RC parallel circuit that simulates the second polarization characteristic of the energy storage device showing a transient response during constant current charge and discharge of the energy storage device characterized by a second time constant larger than the first time constant,
respective values of a resistive device and a capacitive device included in the second RC parallel circuit are set on a basis of the SOC-operating voltage characteristic during constant current charge and discharge of the energy storage device in the high change-amount region, and
values of respective resistive devices included in the first RC parallel circuit and the second RC parallel circuit are set on a basis of a charge voltage-polarization voltage characteristic.

2. The development support apparatus according to claim 1, wherein respective values of a resistive device and a capacitive device included in the first RC parallel circuit are set on a basis of an SOC-operating voltage characteristic during constant current charge and discharge of the energy storage device in a low change-amount region in which an amount of change in an operating voltage with respect to an amount of change in an SOC is relatively lower than other regions.

3. A development support method using a computer, the development support method comprising:
estimating behavior of an energy storage device by using an equivalent circuit model reflecting a state of charge (SOC)-operating voltage characteristic during constant current charge and discharge of the energy storage device in a high change-amount region where an amount of change in an operating voltage with respect to an amount of change in a SOC of the energy storage device is relatively higher than in other regions among SOC-operating voltage characteristics during constant current charge and discharge of the energy storage device; and
outputting an estimation result of the behavior of the energy storage device,
wherein the energy storage device is a lead-acid battery,
the SOC-operating voltage characteristic includes a first polarization characteristic and a second polarization characteristic,
the equivalent circuit model includes
a resistor that simulates a direct current (DC) resistance component of the energy storage device, a first RC parallel circuit that simulates the first polarization characteristic of the energy storage device showing a transient response during constant current charge and discharge of the energy storage device characterized by a first time constant, and a second RC parallel circuit that simulates the second polarization characteristic of the energy storage device showing a transient response during constant current charge and discharge of the energy storage device characterized by a second time constant larger than the first time constant, respective values of a resistive device and a capacitive device included in the second RC parallel circuit are set on a basis of the SOC-operating voltage characteristic during constant current charge and discharge of the energy storage device in the high change-amount region, and values of respective resistive devices included in the first RC parallel circuit and the second RC parallel circuit are set on a basis of a charge voltage-polarization voltage characteristic.

4. A state detection method using a computer, the state detection method comprising estimating a battery state from a measured value of an energy storage device by using an equivalent circuit model reflecting a state of charge (SOC)-operating voltage characteristic during constant current charge and discharge of the energy storage device in a high change-amount region where an amount of change in an operating voltage with respect to an amount of change in a SOC of the energy storage device is relatively higher than in other regions among SOC-operating voltage characteristics during constant current charge and discharge of the energy storage device, wherein the energy storage device is a lead-acid battery, the SOC-operating voltage characteristic includes a first polarization characteristic and a second polarization characteristic, the equivalent circuit model includes a resistor that simulates a direct current (DC) resistance component of the energy storage device, a first RC parallel circuit that simulates the first polarization characteristic of the energy storage device showing a transient response during constant current charge and discharge of the energy storage device characterized by a first time constant, and a second RC parallel circuit that simulates the second polarization characteristic of the energy storage device showing a transient response during constant current charge and discharge of the energy storage device characterized by a second time constant larger than the first time constant, respective values of a resistive device and a capacitive device included in the second RC parallel circuit are set on a basis of the SOC-operating voltage characteristic during constant current charge and discharge of the energy storage device in the high change-amount region, and values of respective resistive devices included in the first RC parallel circuit and the second RC parallel circuit are set on a basis of a charge voltage-polarization voltage characteristic.

* * * * *